United States Patent [19]
Uchida

[11] Patent Number: 5,994,180
[45] Date of Patent: Nov. 30, 1999

[54] METHOD OF MAKING SRAM HAVING PART OF LOAD RESISTANCE LAYER FUNCTIONS AS POWER SUPPLY LINE

[75] Inventor: Tetsuya Uchida, Tokyo, Japan

[73] Assignee: NEC Corporation, Tokyo, Japan

[21] Appl. No.: 08/917,823

[22] Filed: Aug. 27, 1997

[30] Foreign Application Priority Data

Sep. 17, 1996 [JP] Japan .................................. 8-244452

[51] Int. Cl.⁶ ............................................. H01L 21/8234
[52] U.S. Cl. ........................................... 438/238; 438/384
[58] Field of Search ................................. 438/238, 381, 438/382, 384, 385

[56] References Cited

U.S. PATENT DOCUMENTS

| | | | |
|---|---|---|---|
| 5,665,629 | 9/1997 | Chen et al. | 438/384 |
| 5,683,930 | 11/1997 | Batra et al. | 437/60 |
| 5,686,335 | 11/1997 | Wuu et al. | 437/48 |

FOREIGN PATENT DOCUMENTS 3-248558  11/1991  Japan .

Primary Examiner—Joni Chang
Attorney, Agent, or Firm—Young & Thompson

[57] ABSTRACT

In a method of manufacturing a static memory device, a patterning process is performed to a lamination film composed of a first insulating layer, a first conductive layer, a second insulating layer and a second conductive layer with regions for load resistors. A lamination section of the first insulating layer and the first conductive layer are separated through the first and second patterning processes into first to fourth portions. The first and second portions respectively functioning as parts of the word line which are connected to each other and as the gates of the transfer MOS transistors, and the third and fourth portions respectively functioning as gates of the drive MOS transistors. The second conductive layer is separated through the second patterning process into fifth and sixth portions, and the fifth and sixth portions respectively functioning as parts of the power supply line which are connected to each other and as the load resistors connected to the parts of the power supply line. The fifth and sixth portions are laminated on a set of the first and third portions and a set of the second and fourth portions via the second insulating layer, respectively.

12 Claims, 17 Drawing Sheets

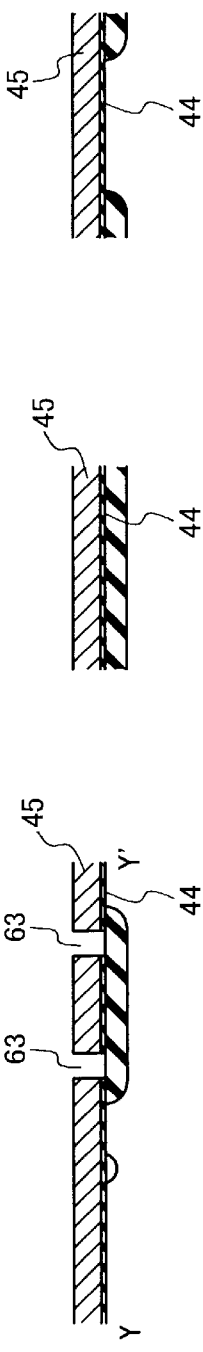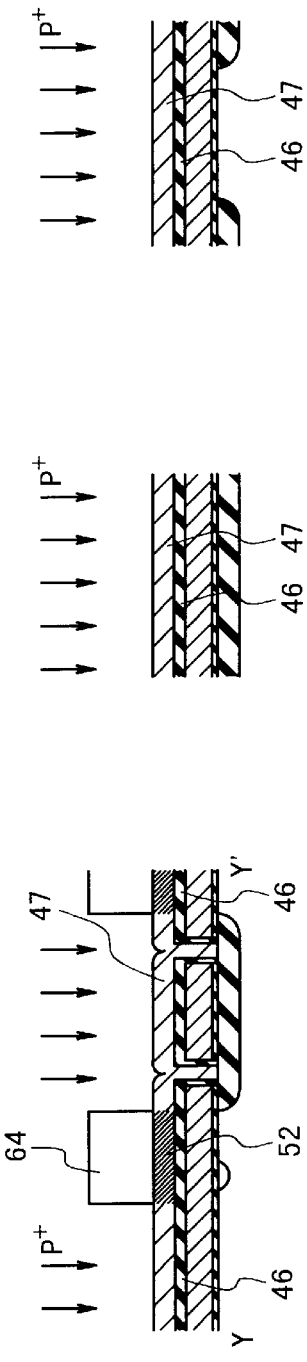

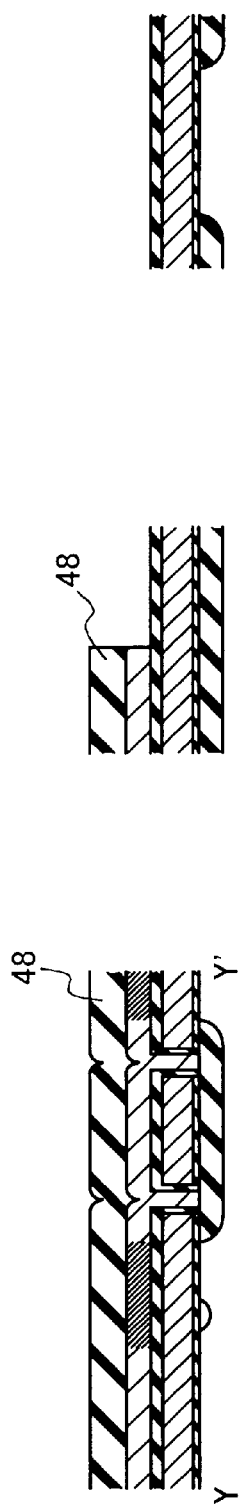
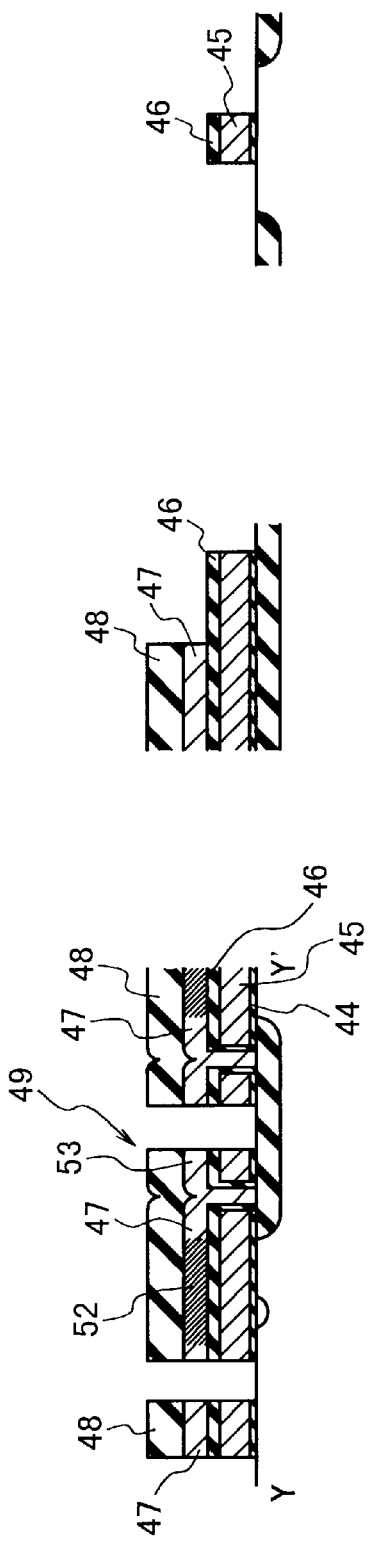

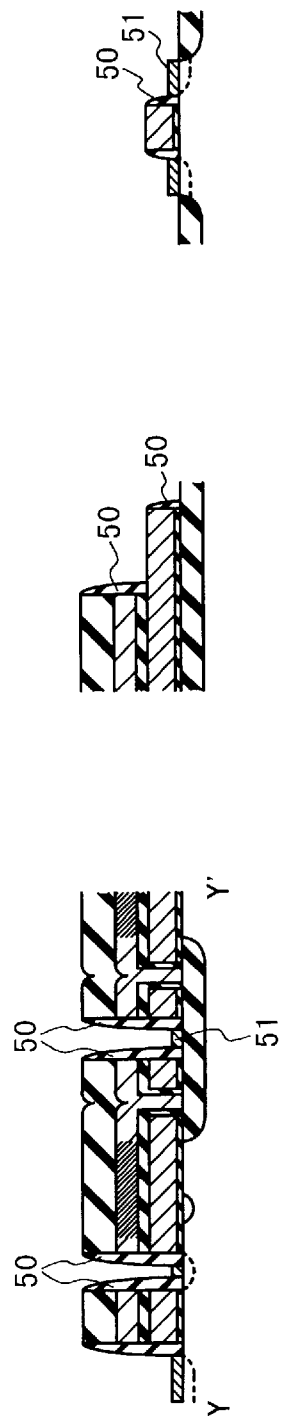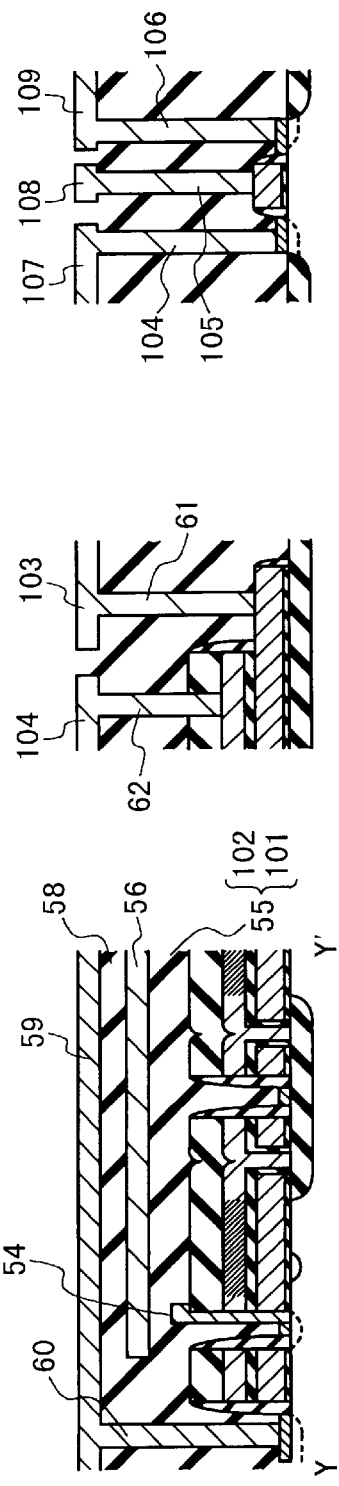

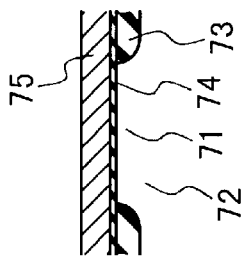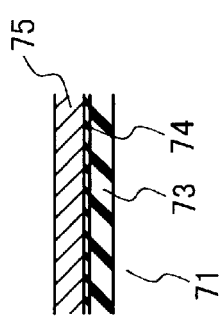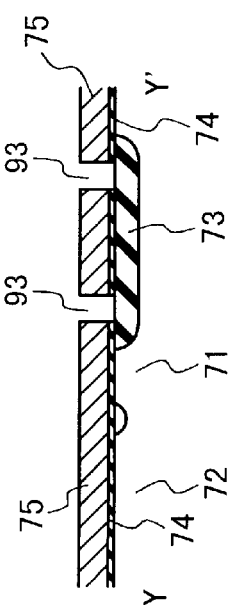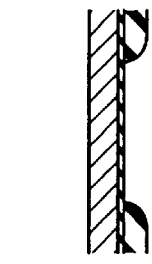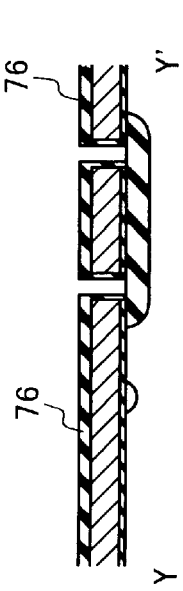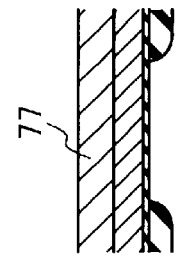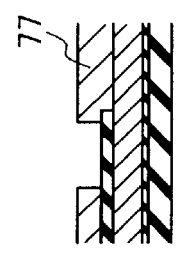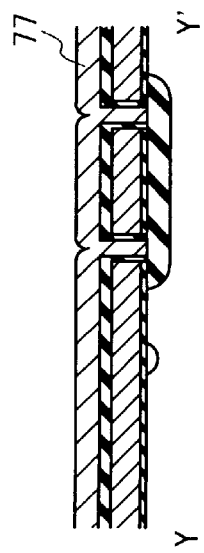

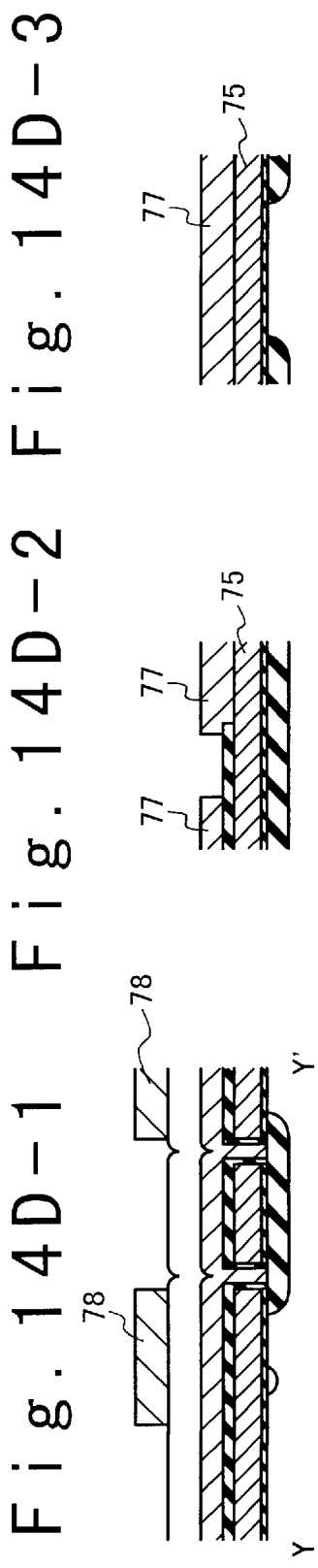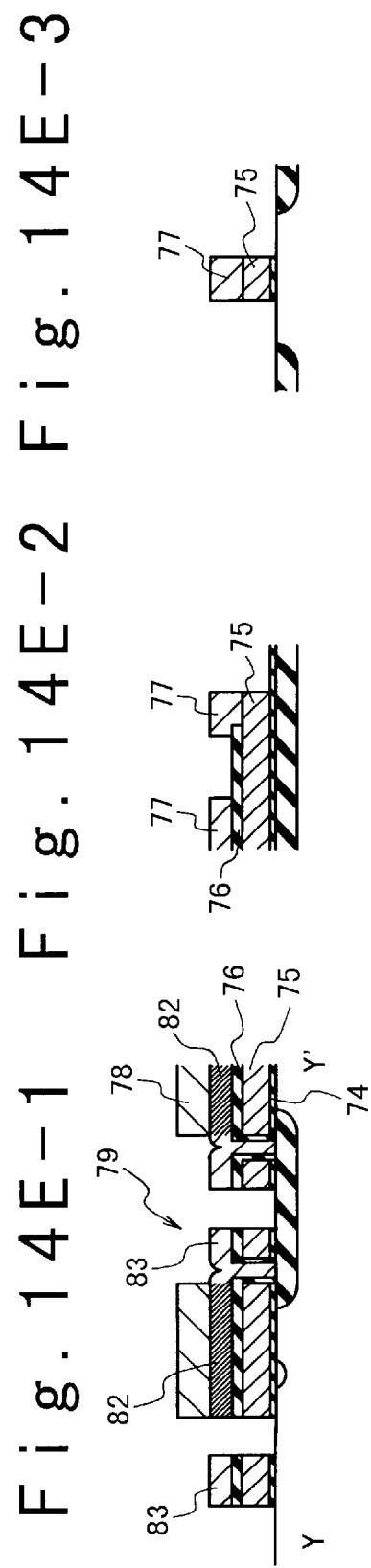

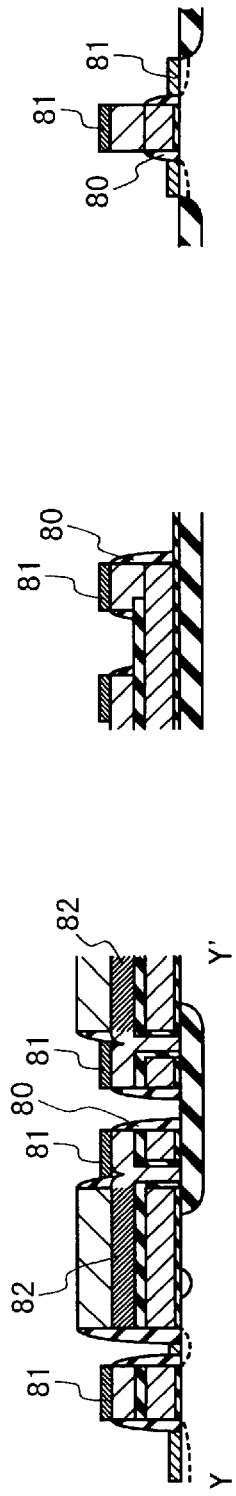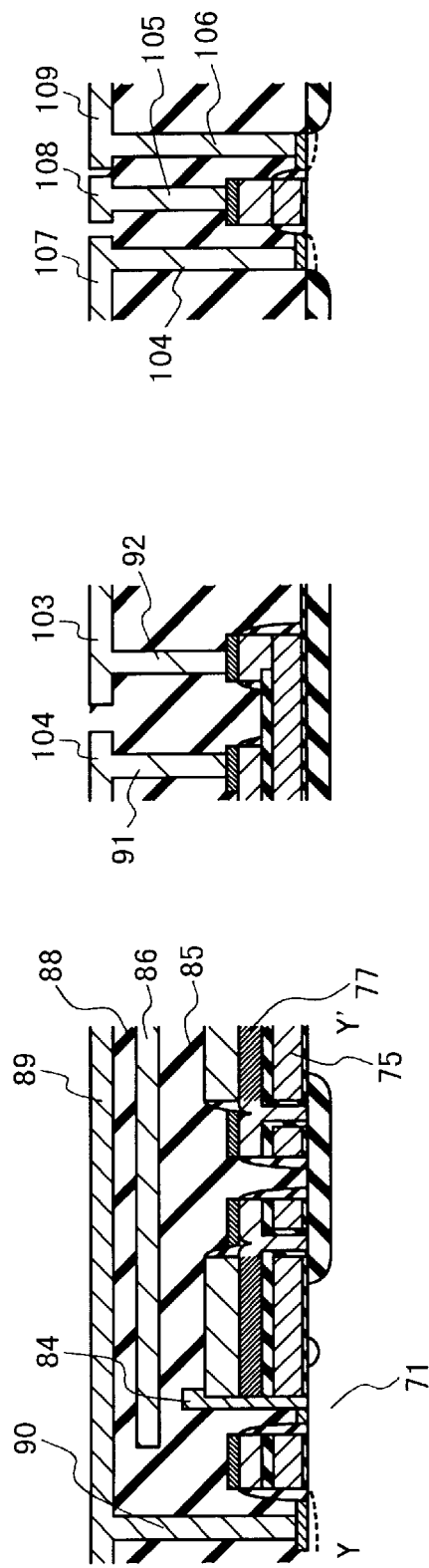

METHOD OF MAKING SRAM HAVING PART OF LOAD RESISTANCE LAYER FUNCTIONS AS POWER SUPPLY LINE

BACKGROUND OF THE INVENTION

1. Field of the Invention

The present invention relates to a semiconductor device and a manufacturing method of the semiconductor device. More particularly, the present invention relates to a resistance load type Static Random Access Memory (SRAM) in which a resistance pattern and a power supply line pattern are formed in a same layer, and a manufacturing method of the resistance load type SRAM.

2. Description of the Related Art

In recent years, in an SRAM, high integration has been carried out. As an SRAM suitable for the high integration, a resistance load type SRAM is conventionally known. A 1-bit memory cell of the resistance load type SRAM is composed of four N-type metal-oxide-semiconductor (MOS) transistors T1 to T4 and two load resistive elements R1 and R2 of high resistance, as in an equivalent circuit shown in FIG. 16.

As shown in FIG. 16, the drain of each of the driving MOS transistors T1 and T2 of a pair is connected to the gate of the other of the MOS transistors T1 and T2. Also, both of drains of the driving MOS transistors T1 and T2 as accumulation nodes N1 and N2 are connected to a power supply line Vcc through the load resistors R1 and R2, respectively. Also, both of the sources of the driving MOS transistors T1 and T2 are connected in common to a ground potential line Vss. The driving MOS transistors T1 and T2 and the load resistors R1 and R2 construct a flip-flop circuit and a small amount of current is supplied from a power supply. One of the source and drain regions of each of the data transfer MOS transistors T3 and T4 is connected to a corresponding one of the accumulation nodes N1 and N2 of the flip-flop circuit. Also, the other of the source and drain regions of each of the MOS transistors T3 and T4 is connected to a corresponding one of digit lines D1 and D2. Both of the gate electrodes of the MOS transistors T3 and T4 are connected to a word line W.

Next, a first structure example of a memory cell in the conventional resistance load type SRAM will be described with reference to FIGS. 1A, 1B, 2A and 2B.

FIG. 1A is a plan view illustrating a lower layer plane structure in the first structure example of the memory cell of the conventional resistance load type SRAM, and FIG. 1B is a plan view illustrating an upper layer plane structure of the conventional first structure example of the memory cell. Also, FIG. 2A is a cross sectional view of the first structure example of the memory cell along the 2A–2A' line shown in FIGS. 1A and 1B, and FIG. 2B is a cross sectional view of the first structure example of the memory cell along the 2B–2B' line shown in FIG. 1A and 1B.

As shown in FIGS. 1A, 1B, 2A and 2B, an element isolation region 2, a gate oxide film 3 and a gate polycide layer 4 are formed in the surface of a silicon substrate 1. The gate polycide layer 4 is formed as a lamination layer of a polysilicon layer and a silicide layer on the polysilicon layer. Source and drain diffusion layers are formed on the surface of the silicon substrate 1 on both sides of the gate polycide layer 4. These MOS transistors correspond to the MOS transistors T1 to T4 shown in FIG. 16, respectively. In this case, the gate polycide layer 4 as the gate electrodes of the MOS transistors T3 and T4 is also used as the word line W shown in FIG. 16.

An interlayer insulating film 5 is laminated on the MOS transistors T1 to T4, and a polysilicon layer 6 is formed and patterned on the interlayer insulating film 5 to form polysilicon patterns 6a and 6b. The polysilicon patterns 6a are doped with phosphorus ions to form low resistance sections, and act as power supply line patterns. Also, the polysilicon patterns 6b are left in a high resistance state. These high resistance sections correspond to the load resistors R1 and R2 shown in FIG. 16, respectively.

An interlayer insulating layer 7 is formed on the polysilicon layer 6, and a metal layer is formed on the interlayer insulating film 7, and then the metal layer is patterned to form ground line patterns 8.

Further, an interlayer insulating film 9 is formed on the interlayer insulating film 7 and the ground line patterns B. A metal layer is formed on the interlayer insulating film 9, and then the metal layer is patterned. These metal layers 10 correspond to the digit line D1 and D2 shown in FIG. 16, respectively.

In this case, the polysilicon layer 6b, the gate polycide layer 4 and the silicon substrate 1 are connected by a common contact 11. Also, the metal layer 8 as the ground line patterns and the silicon substrate 1 are connected by ground contacts 12. Further, the metal layers 10 as the digit lines D1 and D2 and the silicon substrate 1 are connected by digit contacts 13.

In the memory cell of the first structure example described above, there is a problem that a short-circuit is easily formed between the ground contact 12 and the polysilicon layer 6b or the gate polycide layer 4. The reason will be described below.

As shown in FIG. 2A, the ground contact 12 must be formed on the silicon substrate 1 between a gate polycide layer 4a and a gate polycide layer 4b such that the ground contact 12 and one of the gate polycide layers 4a and 4b do not form a short-circuit. For its purpose, when a hole for the ground contact 12 is formed, the position of the ground contact 12 must be adjusted in such a manner that it is not displaced with respect to the patterns of the gate polycide layers 4.

However, the ground contact 12 must be formed between the polysilicon layers 6a and 6b formed in the upper layer of the gate polycide layers 4. Therefore, the position of the ground contact 12 must be also adjusted in such a manner that it is not displaced with respect to the polysilicon layers 6a and 6b.

Generally, in the step that the layout of a memory cell is designed, the polysilicon layers 6b are designed to be formed on the positions straightly above the gate polycide layers 4a and 4b. Therefore, if the ground contact 12 is formed in such a manner that a short-circuit is not formed between the ground contact 12 and each of the gate polycide layers 4a and 4b, the short-circuit would not be formed between the ground contact 12 and each of the polysilicon layers 6b.

In actual, however, because a patterning process of the gate polycide layer 4 and a patterning process of the polysilicon layer 6 are separately performed in the manufacturing step, both of the gate polycide layers 4a and 4b and the polysilicon layers 6b are never completely coincident with each other. Thus, there is a slight position displacement between these two patterns.

For this reason, when the hole for the ground contact 12 is formed, if the position of the ground contact 12 is adjusted to be suitable for the gate polycide layers 4a and 4b, a short-circuit becomes easy to be formed between the ground contact 12 and the polysilicon layers 6b. On the other hand, when the position of the ground contact 12 is adjusted to be suitable for the polysilicon layers 6b, a short-circuit becomes easy to be formed between the ground contact 12 and the gate polycide layers 4a and 4b.

A second structure example of a memory cell formed to solve the above problem is disclosed in Japanese Laid Open Patent Disclosure (JP-A-Heisei 3-248558). Hereinafter, the second structure example of a memory cell of a conventional resistance load type SRAM mentioned in the above reference will be described with reference to FIGS. 3A, 3B, 4A and 4B.

FIG. 3A is a plan view illustrating the lower layer plane structure of a memory cell in the second structure example of a memory cell of conventional resistance load type SRAM, and FIG. 3B is a plan view illustrating the upper layer plane structure of the memory cell. Also, FIG. 4A is a cross sectional view in the second structure example of the memory cell along the 4A–4A' line in FIGS. 3A and 3B, and FIG. 4B is a cross sectional view in the second structure example of the memory cell along the 4B–4B' line in FIGS. 3A and 3B.

As shown in FIGS. 3A and 3B and FIGS. 4A and 4B, an element isolation region 22 is formed in the surface of a silicon substrate 21. Further, a gate lamination film composed of a gate oxide film 23, a gate polycide layer 24, a first silicon oxide film 25, a polysilicon layer 26, and a second silicon oxide film 27 is formed. Then, the gate lamination film is patterned to form gate lamination film patterns 28. Source and drain diffusion layers are formed on the surface of the silicon substrate 21 on both sides of each of the gate lamination film patterns 28. These correspond to the MOS transistors T1 to T4 shown in FIG. 16, respectively.

In this case, the gate polycide layers 24 as the gate electrode of the MOS transistors T3 and T4 are also used as the word line W shown in FIG. 16. The polysilicon layer 26 of the gate lamination film pattern 28 acts as a load resistor and corresponds to the load resistor R1 or R2 shown in FIG. 16.

Also, as shown in FIG. 4B, in a portion 28a of the gate lamination film pattern 28 which corresponds to the gate electrode of one of the driving MOS transistors T1 and T2 shown in FIG. 16, a portion of the gate oxide film pattern 23 and a portion of the first silicon oxide film pattern 25 are previously removed so as to electrically connect the gate polycide layer 24 as the gate electrode and the polysilicon layer 26 as the load resistor to the drain diffusion layer of the other driving MOS transistors.

An interlayer insulating film 29 is laminated on these MOS transistors T1 to T4, and power supply line patterns 30 and ground line patterns 31 are formed on the interlayer insulating film 29. The power supply line pattern 30 and the polysilicon layer 26 are connected by a power supply contact 32. Also, the ground line pattern 31 and the silicon substrate 21 are connected by a ground contact 33. Further, an interlayer insulating film 34 is formed on the interlayer insulating film 29, the power supply line patterns 30 and the ground line patterns 31. Then, a metal layer is formed on the interlayer insulating film 34 and is patterned. The patterns 35 correspond to the digit lines D1 and D2 shown in FIG. 16, respectively. In this case, the metal layers 35 as the digit lines D1 and D2 and the silicon substrate 21 are connected by digit contacts 36.

In the memory cell of the second structure example described above, the polysilicon layer 26 and the gate polycide layer 24 as the load resistors are laminated and are patterned at the same time to form the gate lamination film pattern 28. Therefore, if a position adjustment is performed with respect to the gate lamination film pattern 28 when a hole for the ground contact 33 is formed, the ground contact 33 can be formed in such a manner that a short-circuit is not formed to neither in the polysilicon layer 26 nor in the gate polycide layer 24 as the load resistor.

By the way, in the second structure example of the memory cell of the conventional resistance load type SRAM described above, the polysilicon layer 26 as the load resistor and the power supply line pattern 30 are connected by the power supply contact 32. A contact forming area 37 in which the power supply contact 32 is formed needs to be previously provided for the gate lamination film pattern 28 as the gate electrode of each of the driving MOS transistors T1 and T2 as shown in FIG. 3A. Therefore, there is a problem in increase of the area of the memory cell. In this manner, the SRAM can not be highly integrated.

Also, there is a case that the hole for the power supply contact 32 is formed to have a slight displacement in the adjustment, and the power supply contact 32 is formed out of the contact forming area 37. In this case, a portion of the power supply contact 32 is formed on the side of the gate lamination film pattern 28. Thus, because the gate polycide layer 24 and the power supply contact 32 are electrically connected by the power supply contact 32, there is a problem that the memory cell does not operate in a normal state.

In this manner, because the mask positioning margin in the manufacture process is small, there is a problem of low productivity.

SUMMARY OF THE INVENTION

The present invention is accomplished in the light of the circumstances mentioned above. An object of the present invention is to provide a semiconductor device and a manufacturing method, in which a short-circuit is difficult to be formed between a ground contact and a gate electrode or a load resistor.

Another object of the present invention is to provide a semiconductor device and a manufacturing method, in which it is possible to make cell area small and it is possible to make a mask adjustment margin larger.

In order to achieve an aspect of the present invention, a method of manufacturing a static memory device whose memory cell is composed of transfer MOS transistors and a flip-flop which is composed of drive MOS transistors and load resistors, gates of the transfer MOS transistors being connected to a word line and the load resistors being connected to a power supply line, includes the steps of:

forming a first insulating layer on a semiconductor substrate in a memory cell region;

forming a first conductive layer on the first insulating layer in the memory cell region;

performing a first patterning process to the first conductive layer;

forming a second insulating layer in the memory cell region;

forming a second conductive layer with regions for the load resistors in the memory cell region;

performing a second patterning process to a lamination film composed of the first insulating layer, the first conductive layer, the second insulating layer and the second conductive layer, wherein a lamination section of the first insulating layer and the first conductive layer are separated through the first and second patterning processes into first to fourth portions, the first and second portions respectively functioning as parts of the word line which are connected to each other and as the gates of the transfer MOS transistors, and the third and fourth portions respectively functioning as gates of the drive MOS transistors, and wherein the second conductive layer is separated through the second patterning process into fifth and sixth portions, the fifth and sixth portions respectively functioning as parts of the power supply line which are connected to each other and as the load resistors connected to the parts of the power supply line, and wherein the fifth and sixth portions are laminated on a set of the first and third portions and a set of the second and fourth portions via the second insulating layer, respectively; and connecting the fifth and sixth portions to the third and fourth portions through contacts such that the gates of the drive MOS transistors are connected to the parts of the power supply line via the load resistors, respectively.

The first conductive layer may be a polysilicon layer or a laminate layer of a polysilicon layer with impurity ions doped and a silicide layer.

The method may further include the step of forming a silicide layer on the parts of the power supply line of the fifth and sixth portions. Also, the step of forming a second conductive layer may include the steps of:

forming a polysilicon layer on the second insulating layer;

masking the regions for the load resistors; and performing ion implantation to the polysilicon layer using the mask.

In addition, when the first insulating layer, the second first conductive layer, the second insulating layer and the second conductive layer are formed in a contact region in addition to the memory cell region, the method may further include the steps of:

forming a third insulating layer on the second conductive layer in the memory cell region and the contact region;

performing a third patterning process to the second conductive layer and the third insulating layer to expose a part of the second insulating layer in the contact region;

removing the exposed part of the second insulating layer through the second patterning process to expose a part of the first conductive layer in the contact region;

forming side wall insulating layers on a side wall of the third insulating layer and a side wall of the second conductive layer;

forming an interlayer insulating film in the contact region, the interlayer insulating film being formed of a material different from that of the third insulating layer and the side wall insulating layers; and forming a contact hole to the first conductive layer through the interlayer insulating film using an etching gas which etches only the interlayer insulating film.

In order to achieve another aspect of the present invention, a static memory device includes first and second transfer MOS transistors on a semiconductor substrate, gates of the first and second transfer MOS transistors extending to function first and second word lines which are connected to each other, first and second drive MOS transistors on the semiconductor substrate, first and second load resistor layers having load resistive regions and provided above a set of a gate of the first drive MOS transistor and a part of the gate of the first transfer MOS transistor and a set of a gate of the second drive MOS transistor and a part of the gate of the second transfer MOS transistor, respectively, portions of the first and second load resistor layers above the gates of the first and second transfer MOS transistors extending to function first and second power supply lines which are connected to each other, respectively, and common contacts provided to connect the first load resistor layer to the gate of the first drive MOS transistor and the second load resistor layer to the gate of the second drive MOS transistor, respectively.

In order to achieve still another aspect of the present invention, a method of manufacturing a static memory device whose memory cell is composed of transfer MOS transistors and a flip-flop which is composed of drive MOS transistors and load resistors, gates of the transfer MOS transistors being connected to a word line and the load resistors being connected to a power supply line, includes the steps of:

forming first to fourth gate structure patterns respectively corresponding first to fourth MOS transistors on a semiconductor substrate, wherein each of the first to fourth gate structure patterns is composed of a gate insulating layer and a conductive layer on the gate insulating layer, and the third and fourth gate structure patterns function as parts of the word line which are connected together;

forming a first conductive layer on the first and third gate structure patterns via a first insulating layer and a second conductive layer on the second and fourth gate structure patterns via a second insulating layer, wherein portions of the first and second conductive layers above the third and fourth gate structure patterns function parts of the power supply line which are connected together, and wherein portions of the first and second conductive layers above the first and second gate structure includes regions having resistance values higher than other portions, the regions functioning as load resistors; and connecting the first and second gate structure patterns to the first and second conductive layer, respectively.

BRIEF DESCRIPTION OF THE DRAWINGS

FIGS. 9A-1 to 9G-3 are process cross sectional views illustrating a manufacturing method of the resistance load type SRAM according to the first embodiment of the present invention, wherein FIGS. 9A-1 to 9G-1 are diagrams for the memory cell area, FIGS. 9A-2 to 9G-2 are diagrams for the contact area, and FIGS. 9A-3 to 9G-3 are diagrams for the peripheral circuit area;

FIGS. 14A-1 to 14G-3 are process cross sectional views illustrating a manufacturing method of the resistance load type SRAM according to the second embodiment of the present invention, wherein FIGS. 14A-1 to 14G-1 are diagrams for the memory cell area, FIGS. 14A-2 to 14G-2 are diagrams for the contact area, and FIGS. 14A-3 to 14G-3 are diagrams for the peripheral circuit area;

DESCRIPTION OF THE PREFERRED EMBODIMENTS

A semiconductor memory device such as a resistance load type static random access memory (SRAM) of the present invention will be described below in detail with reference to the attached drawings.

The First Embodiment

Figure 5A:
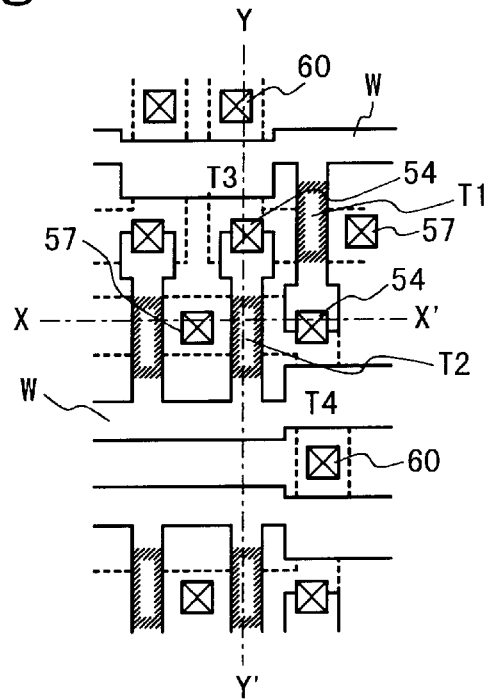
FIG. 5A is a plan view illustrating the lower layer plane structure of a memory cell area of a resistance load type SRAM according to the first embodiment of the present invention.
Figure 5B:
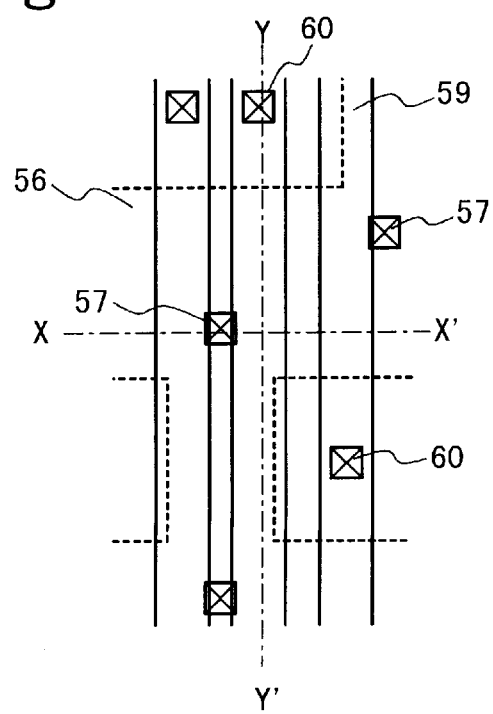
FIG. 5B is a plan view illustrating the upper layer plane structure of the memory cell area shown in FIG. 5A.
Figure 6A:
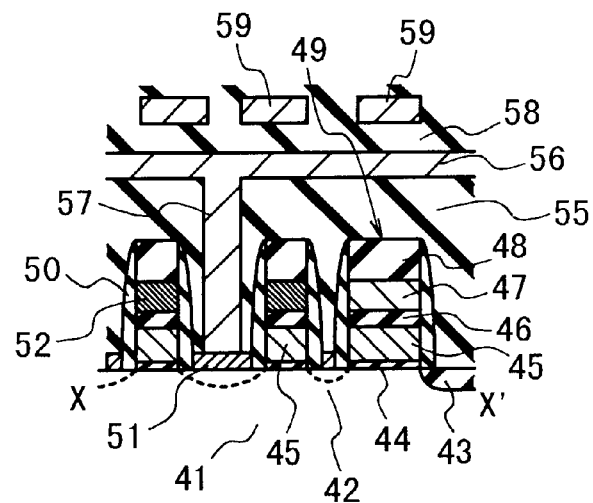
FIG. 6A is a cross sectional view of the memory cell area of the resistance load type SRAM according to the first embodiment of the present invention along the 6A–6A' line in FIGS. 5A and 5B.
Figure 6B:
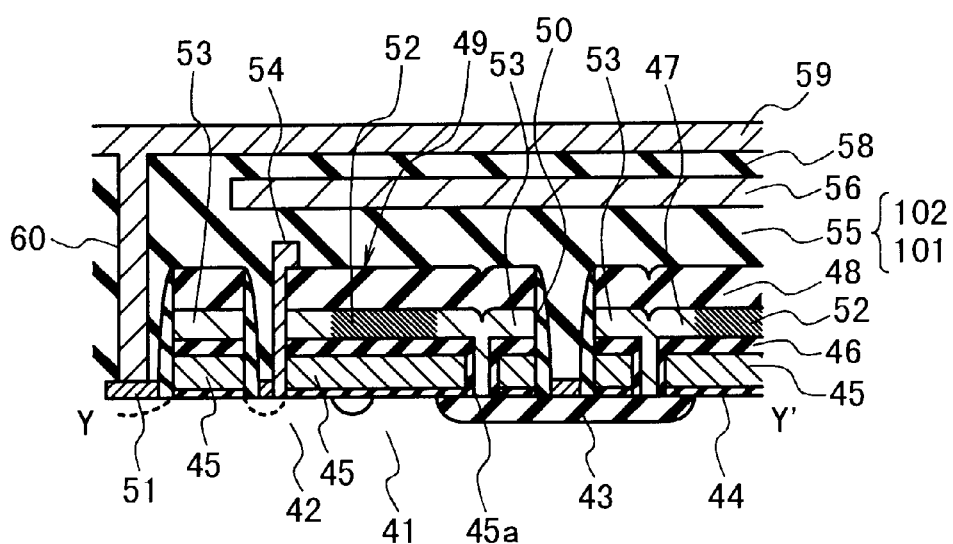
FIG. 6B is a cross sectional view of the memory cell area of the resistance load type SRAM according to the first embodiment of the present invention along the 6B–6B' line in FIGS. 5A and 5B.
Figure 7:
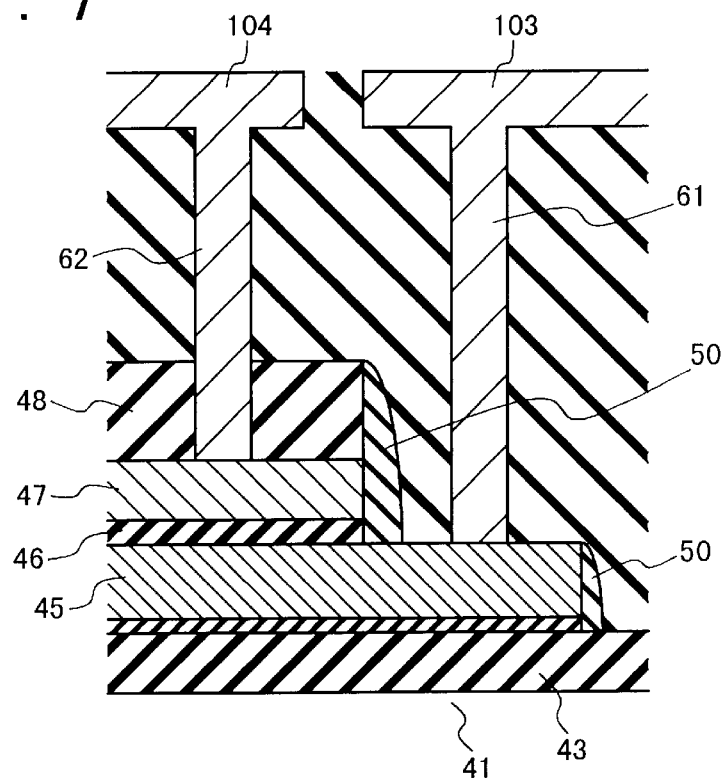
FIG. 7 is a cross sectional view illustrating the structure of a contact area in the resistance load type SRAM according to the first embodiment of the present invention.
Figure 8:
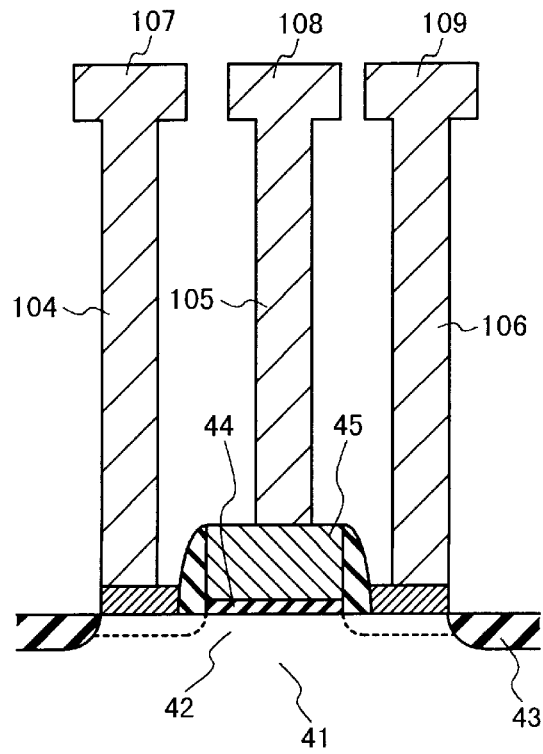
FIG. 8 is a cross sectional view illustrating the structure of a peripheral circuit area of the resistance load type SRAM according to the first embodiment of the present invention.

FIG. 5A is a plan view illustrating a lower layer structure of a memory cell area of the resistance load type SRAM according to the first embodiment of the present invention. FIG. 5B is a plan view illustrating an upper layer structure of the memory cell area of the resistance load type SRAM shown in FIG. 5A. Also, FIG. 6A is a cross sectional view of the memory cell area of the resistance load type SRAM along the X–X' line in FIGS. 5A and 5B. FIG. 6B is a cross sectional view of the memory cell area of the resistance load type SRAM along the Y–Y' line in FIGS. 5A and 5B. FIG. 7 is a cross sectional view of a contact area of the resistance load type SRAM according to the first embodiment of the present invention. Also, FIG. 8 is a cross sectional view in a peripheral circuit area of the resistance load type SRAM shown in FIG. 5A and 5B.

First, as shown in FIGS. 6A and 6B, the structure of the memory cell area in the resistance load type SRAM according to the first embodiment of the present invention will be described. As shown in FIGS. 6A and 6B, the surface of a silicon substrate 41 is divided into an element forming area 42 and an element isolation area 43 in the memory cell area. On these areas, gate lamination film patterns 49 are formed each of which is composed of a gate oxide film pattern 44, a gate polycide layer 45, a silicon oxide film pattern 46, a polysilicon layer 47, and a silicon nitride film pattern 48.

Side wall insulating films 50 each of which is formed of a silicon nitride film are formed on the side walls of the gate lamination film patterns 49 and so on. Source and drain diffusion layers are formed in the surface region of the silicon substrate 41 on both sides of each of the gate lamination film patterns 49. Titanium silicide layers 51 are formed on the source and drain diffusion layers.

Also, the gate polycide layer 45 of the gate lamination film pattern 49 is a lamination composed of a tungsten silicide layer and a polysilicon layer in which phosphorus ions of $1 \times 10^{19}$ to $1 \times 10^{21}/cm^3$ are doped. The gate polycide layers 45 function as the gate electrodes of the MOS transistors T1 to T4 shown in FIG. 16, respectively.

Figure 16:
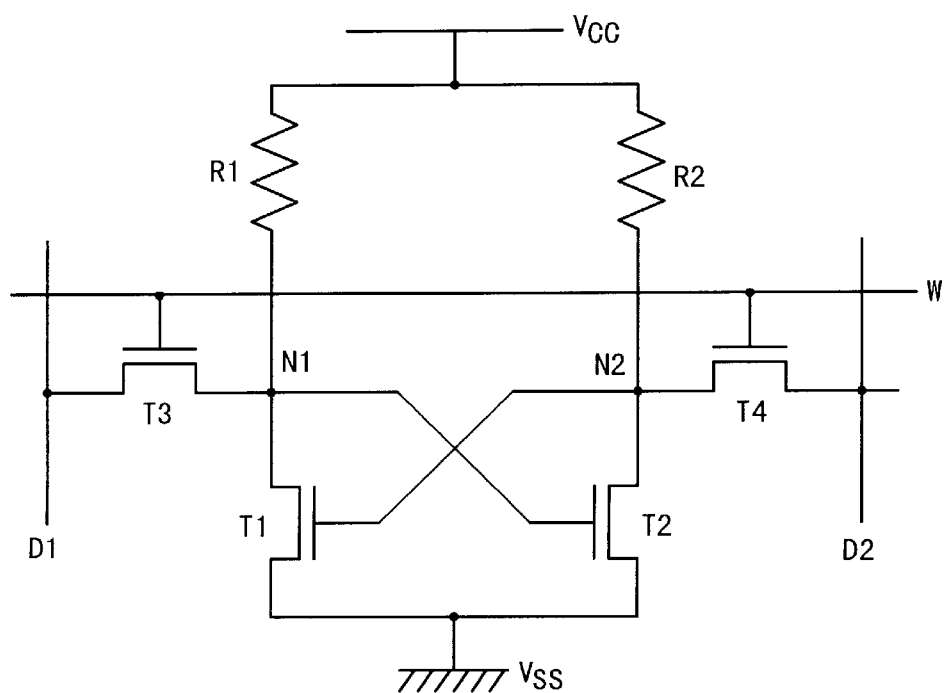
FIG. 16 is an equivalent circuit diagram of a memory cell of the load resistor type SRAM of the present invention.

Of the gate polycide layers 45, the portions which function as the gate electrodes of the MOS transistors T3 and T4 also function as parts of a word line W shown in FIG. 16. Also, portions 52 of the polysilicon layers 47 above the gate polycide layers 45 which function as the gate electrodes of the driving MOS transistors T1 and T2 have the resistance value of about $1 \times 10^{11}$ to $1 \times 10^{13}$ Ω and functions as load resistors 52, i.e., as the load resistors R1 and R2 shown in FIG. 16. On the other hand, the portion of the polysilicon layers 47 above the gate polycide layers 45 which function as the gate electrodes of the MOS transistors T3 and T4 and the parts of the word line W have the sheet resistance values of about $1 \times 10^2$ to $1 \times 10^5$ Ω/cm$^2$ and function as parts of the power supply line 53.

In this manner, the gate electrodes of the driving MOS transistors T1 and T2 are formed as the parts of the word line W which are connected together. Also, the polysilicon layers 47 are continuously formed above the word line W and above the gate electrode.

As shown in FIG. 6B, portions of the gate polycide layers 45 of the gate lamination film patterns 49 corresponding to the gate electrodes of the driving MOS transistors T1 and T2 shown in FIG. 16 are in the neighborhood of the word line W. However, the portion 45a of the gate polycide layer 45 is previously removed to electrically separate the gate polycide layer 45 and the word line W. Also, the polysilicon layer 47, the gate polycide layer 45 and the silicon substrate 41 are electrically connected by a common contact 54.

An interlayer insulating film 101 is laminated on the MOS transistors T1 to T4, and a ground line pattern 56 is formed on the interlayer insulating film 55. The ground line pattern 56 and the silicon substrate 41 are connected by a ground contact 57. Further, an interlayer insulating film 102 is formed on the ground line pattern 56 and the interlayer insulating film 101. A metal layer is formed on the interlayer insulating film 58 and is patterned. The metal layers 59 correspond to the digit lines D1 and D2 shown in FIG. 16.

In this case, the metal layers 59 as the digit lines D1 and D2 are connected to the silicon substrate 41 by a digit contact 60.

Next, a contact area will be described with reference to FIG. 7.

In a word line contact section, a portion of the gate lamination film pattern 49 is removed on the gate polycide layer 45 in the contact area. The word contact 61 is formed on this portion. Thus, the gates of the transfer MOS transistors T3 and T4 are connected by the word contacts 61 and a wiring pattern 103. The potential of the word line W is controlled through the word contact 61.

Also, a power supply contact 62 is formed on the polysilicon layer 47 as the power supply line pattern 53. Thus, the power supply line patterns 53 for the load resistors R1 and R2 are connected by the power supply contacts 62 and a wiring pattern 104. In this manner, the power is supplied through the power supply contact 62.

Next, a peripheral circuit area will be described with reference to FIG. 8.

In a peripheral circuit area such as an area where a decoding circuit or a sense amplifier is formed, a portion on the gate polycide layer 45 is removed from the gate lamination film pattern 49 in the memory cell area. The gate polycide layer 45 functions only as a gate electrode.

Next, a manufacturing method of a resistance load type SRAM according to the first embodiment of the present invention will be described with reference to FIGS. 9A-1 to 9G-3. In the following description, a manufacturing process in the memory cell area, the contact area and the peripheral circuit area will be described collectively.

Figure 1A:
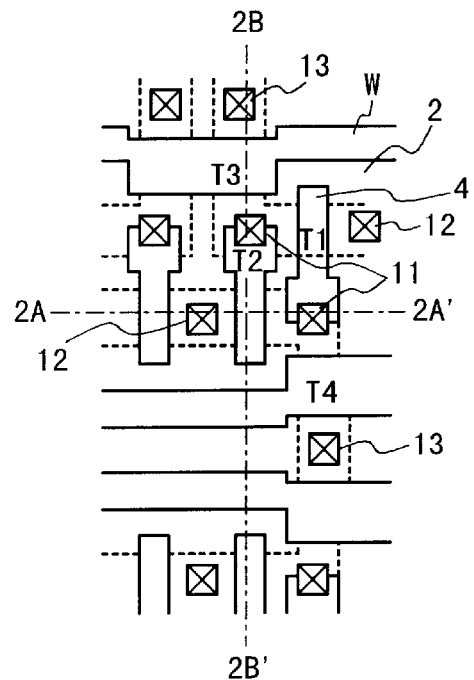
FIG. 1A is a plan view illustrating a lower layer plane structure in a first structure example of a memory cell of a conventional resistance load type SRAM.
Figure 1B:
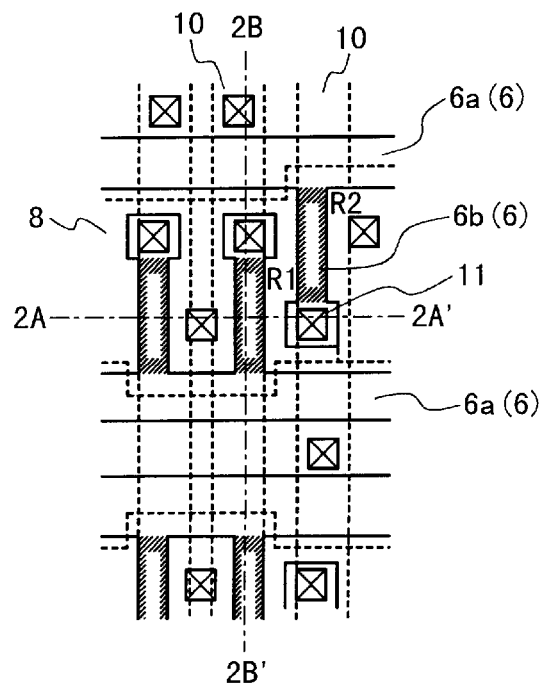
FIG. 1B is a plan view illustrating an upper layer plane structure of the memory cell shown in FIG. 1A.
Figure 2A:
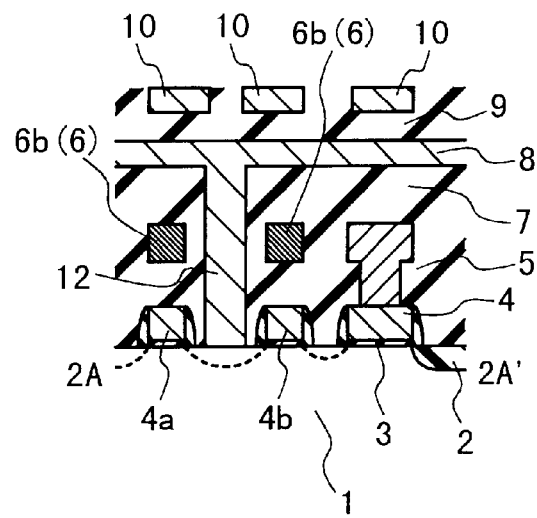
FIG. 2A is a cross sectional view of the first structure example along the 2A–2A' line in FIGS. 1A and 1B.
Figure 2B:
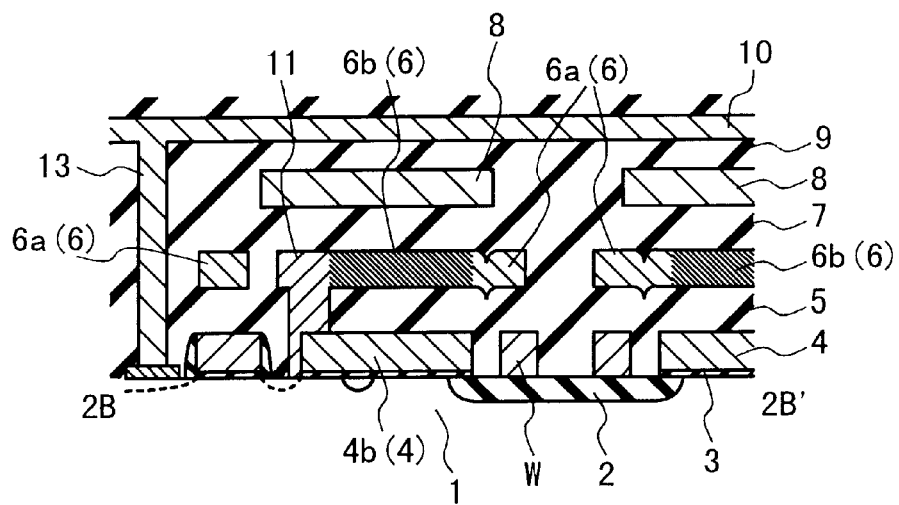
FIG. 2B is a cross sectional view of the first structure example along the 2B–2B' line in FIGS. 1A and 1B.
Figure 3A:
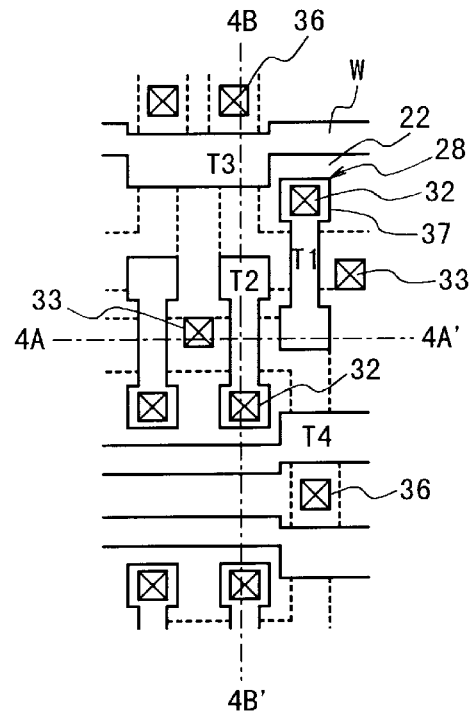
FIG. 3A is a plan view illustrating a lower layer plane structure in the second structure example of a memory cell of a conventional resistance load type SRAM.
Figure 3B:
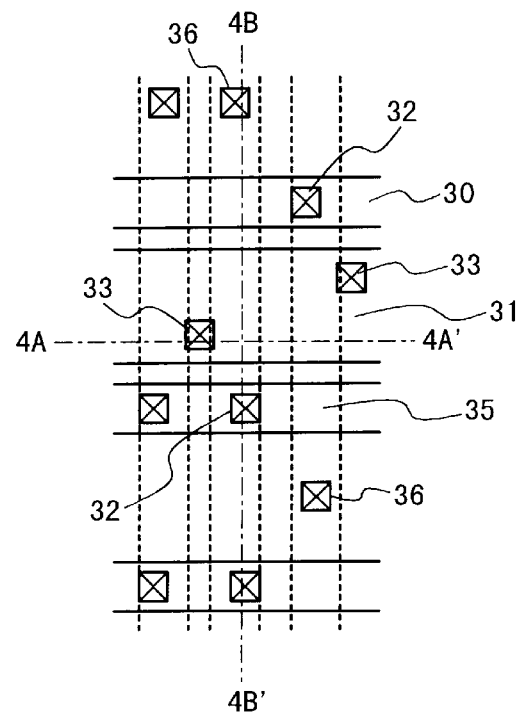
FIG. 3B is a plan view illustrating an upper layer plane structure of the memory cell shown in FIG. 3A.
Figure 4A:
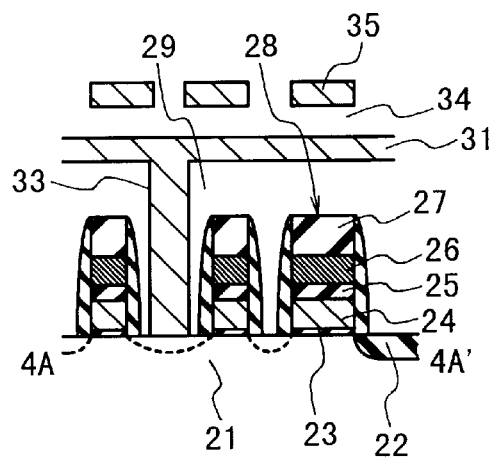
FIG. 4A is a cross sectional view of the second structure example along the 4A–4A' line in FIGS. 3A and 3B.
Figure 4B:
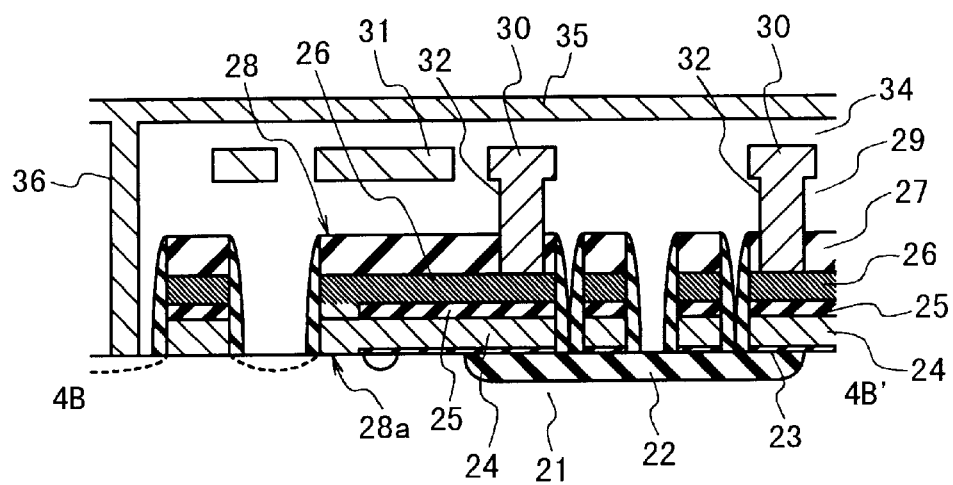
FIG. 4B is a cross sectional view of the second structure example along the 4B–4B' line in FIGS. 3A and 3B.

First, as shown in FIGS. 9A-1 to 9A-3, an element forming area 42 and an element isolation oxide film 43 are formed on a silicon substrate 41 by use of the LOCOS (local Oxidation of Silicon) method and so on. After this, a gate oxide film 44 is formed on the substrate surface to have the film thickness of 3 to 20 nm. Then, a gate polycide layer 45 which is a lamination film of a polysilicon layer and a tungsten silicide layer is formed on the gate oxide film 44 to have the film thickness of 3 to 20 nm.

Figure 10A:
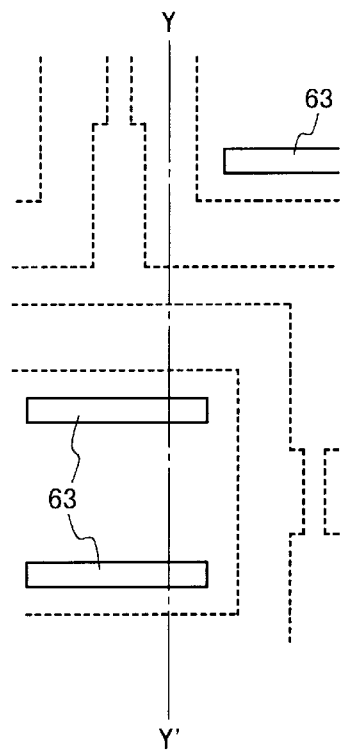
FIGS. 10A to 10D are process plan views illustrating the manufacturing method of the resistance load type SRAM according to the first embodiment of the present invention.
Figure 10B:
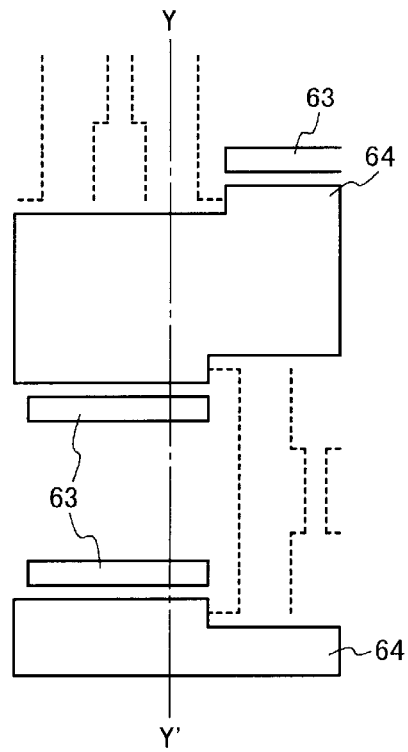

Next, as shown in FIGS. 9B-1 to 9B-3, the gate polycide layer 45 is patterned in such a manner that the shape of a gate polycide layer 63 is removed as shown in FIG. 10A. Next, a silicon oxide film 46 is formed on the whole substrate surface to have the film thickness of 10 to 100 nm. Then, a polysilicon layer 47 is formed on the silicon oxide film 46 to have the film thickness of 30 to 150 nm. After that, a photo-resist mask 64 is formed in the memory cell area to have the shape shown in FIG. 10B. In this case, the photo-resist mask is not formed in the contact area and the peripheral circuit area. The portion covered with the photo-resist mask 64 functions as a load resistor 52. After that, as shown in FIG. 9C-1 to 9C-3, for example, phosphorus ion $P^+$ are implanted to have a dose quantity of about $1 \times 10^{14}$ to $1 \times 10^{16}$ atoms/cm$^2$, using the photo-resist mask 64 as a mask.

Next, after the photo-resist mask 64 is removed, heat treatment is performed at the high temperature of about 800 to 1000° C. to activate the implanted phosphorus ions. Through this process, the sheet resistance value decreases to about $1 \times 10^2$ to $1 \times 10^5$ $\Omega$/cm$^2$ in a portion of the polysilicon layer 47 where the phosphorus ions are implanted.

Next, as shown in FIGS. 9D-1 to 9D-3, after a silicon nitride film 48 is formed on the whole substrate surface, the silicon nitride film 48 and the polysilicon layer 47 are removed entirely in the peripheral circuit area and partially in the contact area. In this process, an etching gas having a high selection ratio to the silicon oxide film is used, and anisotropic etching is performed to the silicon nitride film 48 and the polysilicon layer 47 using the silicon oxide film 46 as an etching stopper.

Next, as shown in FIGS. 9E-1 to 9E-3, a lamination film which is composed of the gate oxide film 44, the gate polycide layer 45, the silicon oxide film 46, the polysilicon layer 47, and the silicon nitride film 48 is patterned by use of the well known photolithography technique and anisotropic etching technique. In this case, at first, the etching gas which does not etch the silicon oxide film 46 is used and only the silicon nitride film 48 and polysilicon layer 47 are etched by use of the anisotropic etching technique. In this process, the area such as the peripheral circuit area where the top layer of the lamination film is the silicon oxide film 46 is not etched.

Next, an etching is performed to remove the silicon oxide film 46 using the gas which etches the silicon oxide film. Further, an etching is performed to remove the polysilicon layer 47 using the gas which etches a polysilicon layer.

Figure 10C:
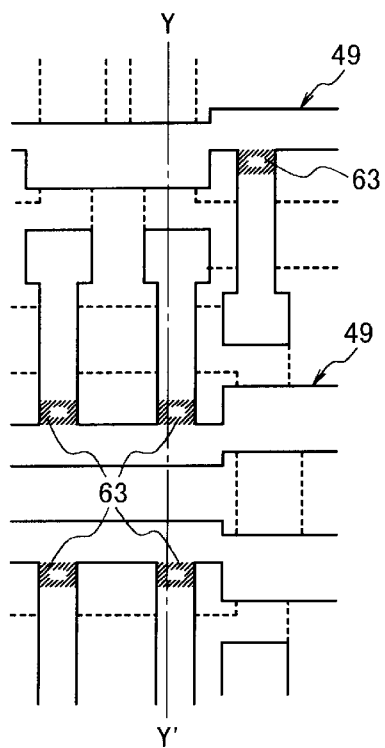
Figure 10D:
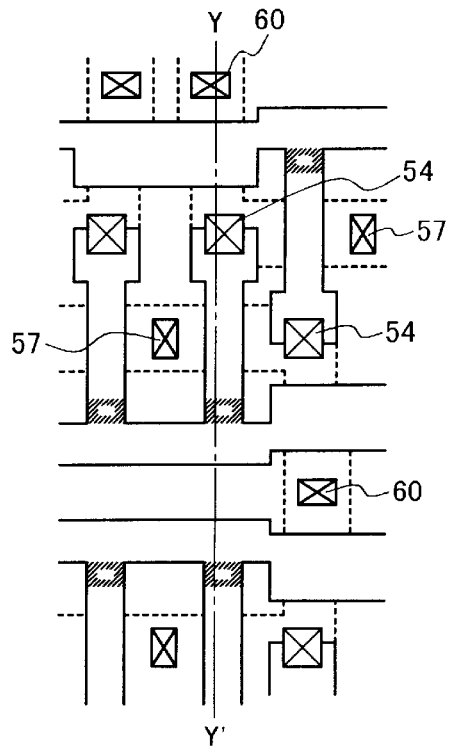

In this way, the gate lamination film pattern 49 including the gate polycide layer 45 and the polysilicon layer 47 is formed in the memory cell area. Also, the gate lamination film which is composed of only the gate polycide layer 45 is formed in the peripheral circuit area. FIG. 10C shows an example of a shape of the gate lamination film pattern 49. In the memory cell area, a portion of the polysilicon layer 47 where phosphorus ions are implanted functions as a power supply line pattern 53, and the other portion where phosphorus ions are not implanted functions as a load resistor 52.

Next, as shown in FIGS. 9F-1 to 9F-3, an ion implantation is performed to form an LDD (Lightly Doped Drain) structure which a high concentration $N^+$ impurities diffusion region is offset for a low concentration $N^-$ impurities diffusion region. Then, a silicon nitride film is formed on the whole substrate surface. Further, anisotropic etching is performed to the silicon nitride film to form side wall nitride films 50 on the side walls of the gate lamination film patterns 49 and so on. Then, an ion implantation is performed to form source and drain diffusion layers.

Next, titanium is sputtered on the whole substrate surface and heat treatment is performed. As a result, titanium reacts with silicon to form a titanium silicide layer 51. Then, a portion of the titanium layer which silicide is not formed is removed. In this way, the titanium silicide layer 51 is formed on the surface of the source and the drain diffusion layers to reduce the layer resistance. Subsequently, a silicon oxide film as an interlayer insulating film 101 is formed on the whole substrate surface.

Next, a forming process of a power supply line pattern and a contact will be described with reference to FIGS. 9G-1 to 9G-3 and 10D.

First, a portion of the interlayer insulating film 101 is etched by use of anisotropic etching to form a hole for a common contact 54, so that a part of the gate lamination film pattern 49 is exposed. In this anisotropic etching, the gas which can collectively etch both of the interlayer insulating film 55 and the side wall nitride film 50 is used.

Next, tungsten is deposited to the whole surface and is etched back to fill the common contact 54 with tungsten. In this way, the common contact 54 is formed to electrically connect the gate polycide layer 45, the polysilicon layer 47 and the silicon substrate 41.

Next, after a silicon oxide film as an interlayer insulating film 102 is formed on the whole substrate surface, a hole for a ground contact 57 is formed to reach the source of the driving MOS transistors T1 and T2 in the memory cell area.

At the same time, contact holes are formed to reach the source diffusion layer, the drain diffusion layer and the gate electrode in the peripheral circuit area. In this case, the formation of the holes is performed by use of the anisotropic etching. Such gas is used that selectively etches the interlayer insulating film 55 composed of a silicon oxide film and does not etch the side wall insulating film 50 composed of a silicon nitride film.

Next, aluminium is deposited on the whole substrate surface and is patterned to form the ground contact 57 and a ground line pattern 56 in the memory cell area. Also, the contacts 104, 105 and 106 for the peripheral circuit and aluminium line patterns 107, 108 and 109 are formed in the peripheral circuit area. In this case, the formation of the ground contact 57 is performed using the gas which does not etch the side wall nitride film 50. For this reason, even if a slight position displacement occurs in case of formation of the hole for the ground contact 57, the ground contact 57 never forms a short-circuit with the gate polycide layer 45 and the load resistor 52.

Subsequently, a silicon oxide film is formed as the interlayer insulating film 58 on the whole substrate surface, and a hole for a digit contact 60 is formed. Then, aluminium is deposited on the whole substrate surface and is patterned. As a result, a metal layer 59 as the digit contact 60 and the digit lines D1 and D2 are formed in the memory cell area.

In this process, like the above mentioned process, the formation of the hole for the digit contact 60 is performed using the gas which does not etch the side wall nitride film 50. Therefore, even if a slight position displacement occurs when the hole for the digit contact 60 is formed, the digit contact 60 does not form a short-circuit with the gate polycide layer 45 and the power supply line pattern 53.

In this way, according to the structure and the manufacture process of the SRAM in this embodiment, the load resistors 52 and the power supply line pattern 53 are formed of the same polysilicon layer 47 of the gate lamination film pattern 49. Thus, unlike the conventional case where the load resistor 52 and the power supply line pattern 53 are formed of the separate layers, there is no need to form a power supply contact to connect the load resistor 52 and the power supply line pattern 53.

Therefore, first, because there is no need to provide the area for forming the above contact in the memory cell area, the cell area can be reduced and the high integration of SRAM can be achieved.

Also, second, in a case where the load resistors 52 and the power supply line patterns 53 are formed of the separate layers like the conventional method, when a slight displacement is in formation position of the hole for the above power supply contact, there is the possibility that the power supply contact is formed out of the contact forming area. In this case, because the gate polycide layer 45 of the gate lamination film pattern 49 is electrically connected to the power supply line pattern 53, there is a problem in that the SRAM does not operate normally. However, such a problem is not caused in the manufacturing method according to the first embodiment of the present invention. Therefore, the productivity can be improved.

Further, in the above first embodiment, the power supply line pattern 53 exists in the gate lamination film pattern 49. After the gate lamination film pattern 49 is formed, the source and the drain diffusion layers are formed. For this reason, the activation of the impurity ions in the power supply line pattern 53 can be performed before the source and drain diffusion layers are formed. Therefore, unlike the first structure example of the above-mentioned conventional memory cell, there is no need to perform the heat treatment after the source and drain diffusion layers are formed. As a result, such a problem can be eliminated that the heat treatment for activation of the impurity ions in the power supply line pattern is performed, so that the impurity ions in the source and drain diffusion layers diffuse to form deep junctions. Thus, there is no problem in that the short channel effect increases and in that cohesion occurs in the titanium silicide layers on the diffusion layers such that the layer resistance increases.

The Second Embodiment

Figure 11A:
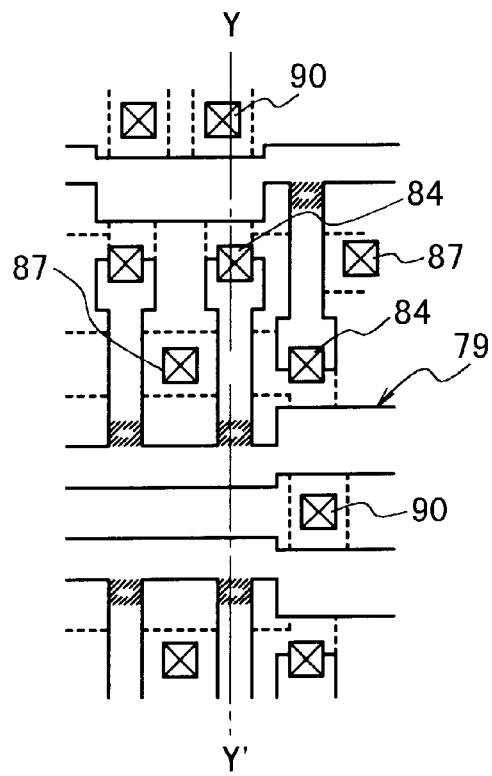
FIG. 11A is a plan view illustrating the lower layer plane structure of a memory cell area of the resistance load type SRAM according to the second embodiment of the present invention.
Figure 11B:
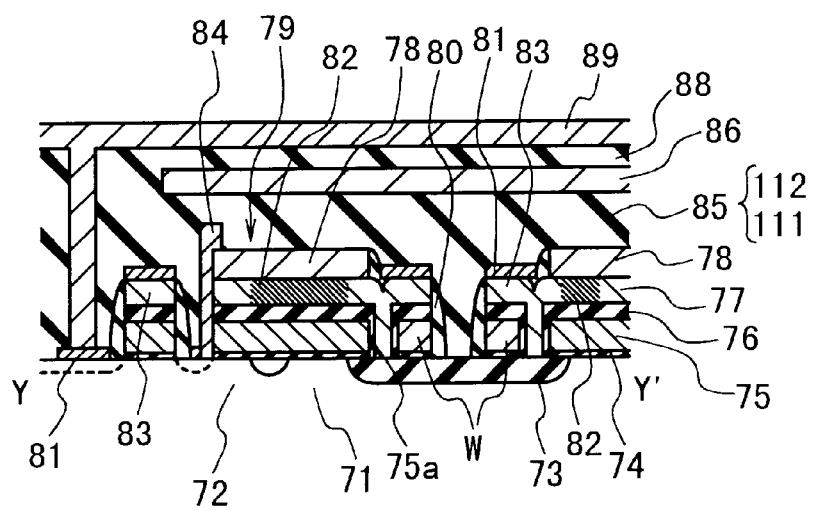
FIG. 11B is a cross sectional view of the memory cell area along the 11B–11B' line in FIG. 11A.
Figure 12:
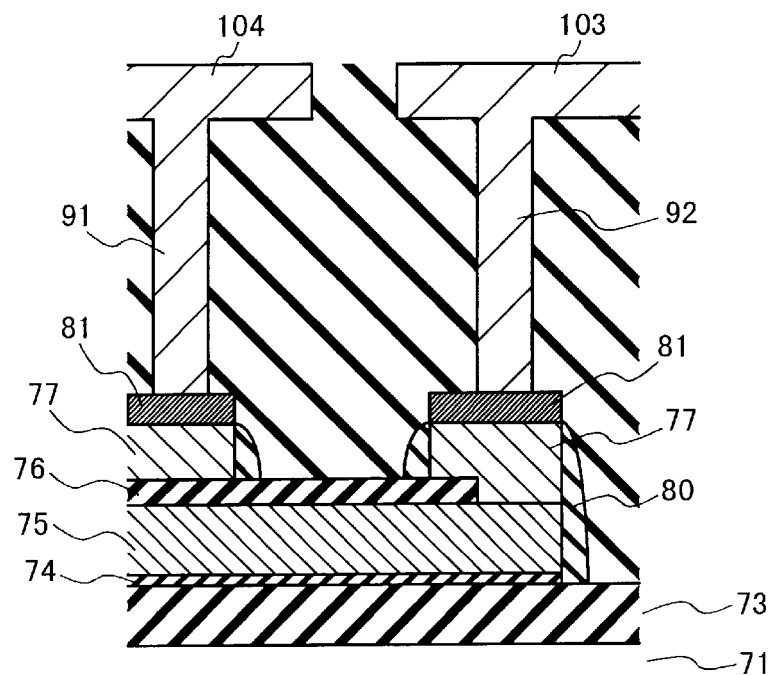
FIG. 12 is a cross sectional view illustrating the structure of a contact area of the resistance load type SRAM according to the second embodiment of the present invention.
Figure 13:
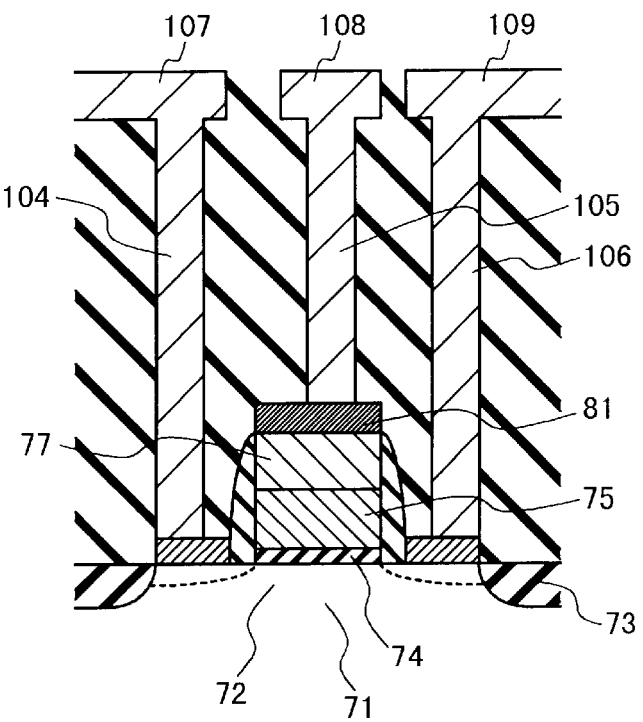
FIG. 13 is a cross sectional view illustrating the structure of a peripheral circuit area of the resistance load type SRAM according to the second embodiment of the present invention.

Next, the SRAM according to the second embodiment of the present invention will be described below. FIG. 11A is a plan view illustrating the lower layer structure of a memory cell area in the resistance load type SRAM according to the second embodiment of the present invention. FIG. 11B is a cross sectional view of the memory cell area in the resistance load type SRAM along the 11B–11B' line in FIG. 11A. FIG. 12 is a cross sectional view of a contact area in the resistance load type SRAM according to the second embodiment of the present invention. FIG. 13 is a cross sectional view of a peripheral circuit area in the resistance load type SRAM.

First, a structure of a memory cell of the second embodiment will be described with reference to FIGS. 11A and 11B. As shown in FIG. 11B, the surface of a silicon substrate 71 is divided into an element forming area 72 and an element isolation area 73. On the silicon substrate 71, a gate lamination film pattern 79 which is composed of a gate oxide film 74, a gate polycide layer 75, a silicon oxide film 76, a polysilicon layer 77, and a silicon nitride film 78 is formed. Side wall silicon nitride films 80 are formed on the side walls of the gate lamination film patterns 79 and so on. Source and drain diffusion layers are formed in the surface layer of the silicon substrate 71 on the both sides of the side wall silicon nitride films 80. Titanium silicide layers 81 are formed on the source and drain diffusion layers.

Also, the gate polycide layer 75 of the gate lamination film pattern 79 is a lamination film of a tungsten silicide layer and a polysilicon layer. In this case, phosphorus ions of about $1\times10^{19}$ to $1\times10^{21}/cm^3$ are doped into the polysilicon layer of the gate polycide layer 75. The gate polycide layer 75 functions gate electrodes of the MOS transistors T1 to T4 shown in FIG. 16. Portions of the gate polycide layer 75 corresponding to the gate electrodes of the MOS transistors T3 and T4 also function as parts of a word line W shown in FIG. 16.

Also, the polysilicon layer 77 of the gate lamination film pattern 79 function as load resistors 82 which have the resistance value of about $1\times10^{11}$ to $1\times10^{13}$ Ω on the gate polycide layers 75 as the gate electrodes of the driving MOS transistors T1 and T2. The load resistors correspond to the load resistors R1 and R2 shown in FIG. 16.

In this case, the gate lamination film pattern 49 in the first embodiment almost corresponds to the gate lamination film pattern 79 in the second embodiment. However, according to the second embodiment, the silicon nitride film 78 is not formed on the polysilicon layer 77 as an upper layer of the gate polycide layers 75 which function as the gate electrodes and the word line W of the MOS transistors T3 and T4. Instead, a titanium silicide layer 81 is formed on the polysilicon layer 77. Also, the polysilicon layer 77 as the lower layer of the gate polycide layers 75 can be formed to have low resistance. The polysilicon layer 77 having low resistance functions as a power supply line pattern 83.

In this case, the gate lamination film pattern 79 is formed as a continuous pattern of the gate electrodes of the driving MOS transistors T1 and T2 and the word line W. Thus, the polysilicon layer 77 is formed as a continuous pattern on the word line W and the gate electrode.

However, as shown in FIG. 11B, portions 75a of the gate polycide layer 75 of the gate lamination film pattern 79 are previously removed. The portions 75a are the portions where the word line W is close to the gate polycide layer 75 which corresponds to the gate electrode of the driving MOS transistors T1 and T2 shown in FIG. 16. By this reason, the gate polycide layer 75 and the word line W are electrically separated.

On the other hand, after an interlayer insulating film 111 is formed, the polysilicon layer 77, the gate polycide layer 75 and the silicon substrate 71 are electrically connected by a common contact 84.

An interlayer insulating film 112 is laminated on the MOS transistors T1 to T4, and a ground line pattern 86 is formed on the interlayer insulating film 111. The ground line 86 and the silicon substrate 71 are connected by a ground contact 87.

Further, an interlayer insulating film 88 is formed on the ground line pattern 86 and the interlayer insulating film 85 (111, 112), and then a metal layer 89 is deposited on the interlayer insulation film 88 and is patterned. The metal layers 89 correspond to the digit lines D1 and D2 shown in FIG. 16. In this case, the metal layers 89 as digit lines D1 and D2 and the silicon substrate 71 are connected by digit contacts 90.

Next, a contact area will be described with reference to FIG. 12. As shown in FIG. 12, a portion 77a of the polysilicon layer 77 functions as the power supply line pattern 83 and the titanium silicide layer 81 is removed in the contact area. A power supply contact 91 is formed on the titanium silicide layer 81 and power is supplied through the power supply contact 91.

In the word line contact section, a portion of the silicon oxide film 76 is removed. In this portion, the polysilicon layer 77 is directly formed on the gate polycide layer 75. Further, the titanium silicide layer 81 is formed on the polysilicon layer 77. A word contact 92 is formed on the titanium silicide layer 81 and the potential of the word line W is controlled through the word contact 92.

Next, a peripheral circuit area will be described with reference to FIG. 13.

In the peripheral circuit area, the polysilicon layer 77 and the titanium silicide layer 81 are formed on the gate polycide layer 75 in the portion which corresponds to the gate lamination film pattern 79. A gate electrode is formed of the gate polycide layer 75 and the polysilicon layer 77. Also, titanium silicide layers 81 are formed on the source and the drain diffusion layer.

Next, a manufacturing method of the SRAM in the second embodiment will be described with reference to FIGS. 14A-1 to 14G-3 and FIG. 15. In the following description, a manufacturing process in the memory cell area, the contact area and in the peripheral circuit area will be described collectively.

First, an element forming area 72 and an element isolation oxide film 73 are formed by use of the LOCOS method on a silicon substrate 71. After this, a gate oxide film 74 is formed on the substrate surface to have the film thickness of 3 to 20 nm. Then, a gate polycide layer 75 which is a lamination film of polysilicon and tungsten silicide is formed to have the film thickness of 3 to 20 nm.

Figure 15:
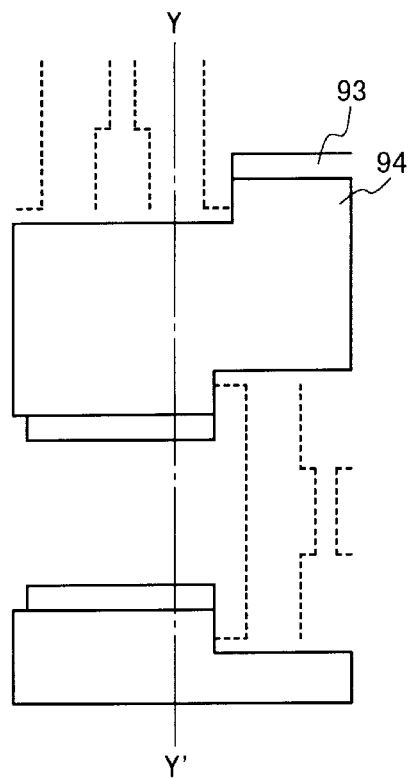
FIG. 15 is a process view illustrating the manufacturing method of the resistance load type SRAM according to the second embodiment of the present invention.

Next, as shown in FIGS. 14A-1 to 14A-3, the gate polycide layer 75 is patterned to have the shape which is shown as a gate polycide layer 93 in FIG. 15. As mentioned above, a portion of the gate polycide layer 75 functions as a gate electrode and the other portion of the gate polycide layer 75 functions as a word line W.

Next, a silicon oxide film 76 is formed to have the film thickness of 10 to 100 nm on the whole substrate surface. Then, as shown in FIGS. 14B-1 to 14B-3, the silicon oxide film 76 is removed in the peripheral circuit area and a portion of the contact area.

Next, a polysilicon layer 77 is formed to have the film thickness of 30 to 150 nm on the whole substrate surface. Then, as shown in FIGS. 14C-1 to 14C-3, a portion of the polysilicon layer 77 is removed in the contact area.

Next, a silicon nitride film 78 is formed on the whole substrate surface. Then, as shown in FIGS. 14D-1 to 14D-3, the silicon nitride film 78 is patterned in the memory cell area to have the shape which is shown as a silicon nitride film 94 in FIG. 15. The portion of the polysilicon layer which is covered with the silicon nitride film functions as a load resistor 82. Also, in the contact area and in the peripheral circuit area, the silicon nitride films 78 are all removed.

After this, as shown in FIGS. 14E-1 to 14-3, a lamination film which is composed of the gate oxide film 74, the gate polycide layer 75, the silicon oxide film 76, the polysilicon layer 77, and the silicon nitride film 78 is patterned by use of the photolithography technique and the anisotropic etching technique.

In this case, first, the etching gas which does not etch the silicon oxide film 76 is used. Thus, only the silicon nitride film 78 and the polysilicon layer 77 are etched by use of the anisotropic etching technique. Subsequently, using the gas which etches a silicon oxide film, an etching is performed to remove the silicon oxide film 76. Further, using the gas which etches a polysilicon layer, an etching is performed to remove the polysilicon layer 77.

Next, after ion implantation is performed to form LDD structure, a silicon nitride film is formed on the whole substrate surface. Then, as shown in FIGS. 14F-1 to 14F-3, the silicon nitride film is etched by use of the anisotropic etching technique to form side wall nitride films 80 on the side walls of the gate lamination film patterns 79 and so on. After that, to form source and drain diffusion layer, for example, arsenic ions are implanted to have a dose quantity of about $1 \times 10^{15}$ to $1 \times 10^{16}$ atoms/cm$^2$. Here, the arsenic ions are implanted into the area where the top layer is the polysilicon layer 77 of the gate lamination film pattern, as well as the source and drain diffusion layers.

After that, heat treatment is performed at the high temperature of about 700 to 1000° C. to activate the injected arsenic ions. The source and drain diffusion layers are formed through the heat treatment. Also, the sheet resistance value is decreased in the area of the polysilicon layer 77 where the arsenic ions are implanted.

Next, titanium is sputtered on the whole substrate surface to form a titanium layer and heat treatment is performed. Titanium reacts with silicon to form a titanium silicide layer. Then, titanium which does not react with silicon is removed. In this way, titanium silicide layers 81 are formed on the source and drain diffusion layers. Also, titanium silicide layers 81 are formed on the region of the gate lamination film pattern which is not covered with the silicon nitride film 78 and in which the polysilicon layer 77 is exposed. The region of the gate lamination film pattern where the titanium silicide layer 81 is formed on the polysilicon layer 77 functions as the power supply line pattern 83.

After that, a silicon oxide film as an interlayer insulating film 85 is formed on the whole substrate surface.

Next, a forming process of a power supply line pattern and a contact will be described with reference to FIGS. 14G-1 to 14G-3.

First, a hole for a common contact 84 is formed in the interlayer insulating film 85 by use of the anisotropic etching technique such that a part of the gate lamination film pattern 79 is exposed. This anisotropic etching is performed using the gas which etches both of the interlayer insulating film 85 and the side wall nitride film 80.

After this, tungsten is deposited to the whole surface and is etched back. Thus, the common contact 84 is filled with tungsten. In this way, the common contact 84 which electrically connects the gate polycide layer 75, the polysilicon layer 77, and the silicon substrate 71 is formed.

Next, a silicon oxide film as an interlayer insulating film 88 is formed on the whole substrate surface. Then, in the memory cell area, a hole for a ground contact 87 is formed to reach the source diffusion layers of the driving MOS transistors T1 and T2. Also, in the peripheral circuit area, a hole for the contact is formed to reach the source and drain diffusion layers and the gate electrode. The forming of the holes are performed by use of the anisotropic etching. In this case, such gas is used that selectively etches the interlayer insulating film 85 composed of silicon oxide film and does not etch the side wall nitride film 80 composed of silicon nitride film.

Next, aluminium is deposited on the whole substrate surface and is patterned. Then, in the memory cell area, the ground contact 87 and the ground line 86 are formed. Also, in the peripheral circuit area, a peripheral circuit contact and an aluminium wiring pattern are formed. In this case, the forming of a hole for the ground contact 87 is performed using the gas which does not etch the side wall nitride films 80. Therefore, even if a slight position displacement occurs in case of forming of the hole for the ground contact 87, the ground contact 87 never forms a short-circuit with the gate polycide layer 75 or with the load resistor 82.

After this, a silicon oxide film is formed as the interlayer insulating film 88 on the whole substrate surface. Then, after a hole for a digit contact 90 is formed in the interlayer insulating film 88, aluminium is deposited on the whole substrate surface, and is patterned. As a result, the digit contact 90 and metal line patterns 89 as the digit lines D1 and D2 are formed in the memory cell area.

In this process, like the above described process, the formation of the hole for the digit contact 90 is performed using the gas which does not etch the side wall nitride film 80. For this reason, even if a slight position displacement occurs in case of forming of a hole for the digit contact 90, the digit contact 90 does not form a short-circuit with the gate polycide layer 75 or with the power supply line pattern 83.

In this way, according to the structure and the manufacture process of the SRAM in the second embodiment, in addition to the effect by the above-mentioned first embodiment, the effect can be obtained that the layer resistance becomes low so that the operation of the SRAM becomes stable, because the titanium silicide layer 81 exists on the power supply line pattern 83.

The present invention is described in detail with reference to the drawing and the embodiment of above, but the structure is not limited to these embodiments. Even if various modifications such as change of the design and so on are performed within the scope which is not apart from the spirit of the present invention, the structure is contained in the present invention.

For example, in the first and second embodiments as described above, the gate polysilicon may be used instead of the gate polycide layers 45 and 75. Also, for example, to make the resistance value of the load resistors 52 and 82 high, phosphorus ions may be implanted into regions of the gate polycide layers 45 and 75 corresponding to the load resistors 52 and 82 with a dose quantity of about $1 \times 10^{13}$ to $1 \times 10^{14}$ atoms/cm$^2$.

Further, a silicon oxide film may be used in place of the silicon nitride films 48 and 78. Also, the side wall insulating films 50 and 80 may be formed of the silicon oxide film instead of the silicon nitride film. Also, the titanium silicide layers 51 and 81 may be not formed.

Further, in the above-mentioned first and second embodiments, the metal layers 59 and 89 as ground line patterns 56 and 86 and the digit lines D1 and D2 are formed in the separate layers. However, these line patterns may be formed with the same layer.

As been described above, according to the semiconductor device and manufacturing method of the present invention, the load resistor and the power supply line pattern are formed with the same polysilicon layer. Therefore, the area for forming the contact which connects these line patterns does not needed in the memory cell, resulting in a small memory cell area. In this manner, the high integration of the semiconductor device can be achieved.

Also, because the load resistor and the power supply line pattern are formed with the same polysilicon layer, a short-circuit is not formed between each of the gate electrode of the memory cell transistor and the load resistors and the power supply line pattern. Therefore, it is possible to make a margin in position adjustment of the mask large in manufacture.

By this reason, the reliability and productivity of the semiconductor device can be improved.

What is claimed is:

1. A method of manufacturing a static memory device whose memory cell is composed of transfer MOS transistors and a flip-flop which is composed of drive MOS transistors and load resistors, gates of said transfer MOS transistors being connected to a word line and said load resistors being connected to a power supply line, comprising the steps of:

forming a first insulating layer on a semiconductor substrate in a memory cell region;

forming a first conductive layer on said first insulating layer in said memory cell region;

performing a first patterning process to said first conductive layer;

forming a second insulating layer in said memory cell region;

forming a second conductive layer with regions for said load resistors in said memory cell region;

performing a second patterning process to a lamination film composed of said first insulating layer, said first conductive layer, said second insulating layer and said second conductive layer, wherein a lamination section of said first insulating layer and said first conductive layer are separated through said first and second patterning processes into first to fourth portions, said first and second portions respectively functioning as parts of said word line which are connected to each other and as said gates of said transfer MOS transistors, and said third and fourth portions respectively functioning as gates of said drive MOS transistors, and wherein said second conductive layer is separated through said second patterning process into fifth and sixth portions, said fifth and sixth portions respectively functioning as parts of said power supply line which are connected to each other and as said load resistors connected to said parts of said power supply line, and wherein said fifth and sixth portions are laminated on a set of said first and third portions and a set of said second and fourth portions via said second insulating layer, respectively; and connecting said fifth and sixth portions to said third and fourth portions through contacts such that said gates of said drive MOS transistors are connected to said parts of said power supply line via said load resistors, respectively.

2. A method according to claim 1, wherein said first conductive layer is a polysilicon layer.

3. A method according to claim 1, wherein said first conductive layer is a polysilicon layer with impurity ions doped and a silicide layer.

4. A method according to claim 1, further comprising the step of:

forming a silicide layer on said parts of said power supply line of said fifth and sixth portions.

5. A method according to claim 1, wherein said step of forming a second conductive layer comprises the steps of:

forming a polysilicon layer on said second insulating layer;

masking said regions for said load resistors; and performing ion implantation to said polysilicon layer using the mask.

6. A method according to claim 1, wherein said first insulating layer, said first conductive layer, said second insulating layer and said second conductive layer are formed in a contact region in addition to said memory cell region, and wherein said method further comprises the steps of:

forming a third insulating layer on said second conductive layer in said memory cell region and said contact region;

performing a third patterning process to said second conductive layer and said third insulating layer to expose a part of said second insulating layer in said contact region;

removing the exposed part of said second insulating layer through said second patterning process to expose a part of said first conductive layer in said contact region;

forming side wall insulating layers on a side wall of said third insulating layer and a side wall of said second conductive layer;

forming an interlayer insulating film in said contact region, said interlayer insulating film being formed of a material different from that of said third insulating layer and said side wall insulating layers; and forming a contact hole to said first conductive layer through said interlayer insulating film using an etching gas which etches only said interlayer insulating film.

7. A method of manufacturing a static memory device whose memory cell is composed of transfer MOS transistors and a flip-flop which is composed of drive MOS transistors and load resistors, gates of said transfer MOS transistors being connected to a word line and said load resistors being connected to a power supply line, comprising the steps of:

forming first to fourth gate structure patterns respectively corresponding first to fourth MOS transistors on a semiconductor substrate, wherein each of said first to fourth gate structure patterns is composed of a gate insulating layer pattern and a conductive layer pattern on said gate insulating layer pattern, and said third and fourth gate structure patterns function as parts of said word line which are connected together;

forming a first conductive layer pattern on said first and third gate structure patterns via a first insulating layer pattern and a second conductive layer pattern on said second and fourth gate structure patterns via a second insulating layer pattern, wherein portions of said first and second conductive layer patterns above said third and fourth gate structure patterns function parts of said power supply line which are connected together, and wherein portions of said first and second conductive layer patterns above said first and second gate structure includes regions having resistance values higher than other portion, the regions functioning as load resistors; and connecting said first and second gate structure patterns to said first and second conductive layer pattern, respectively.

8. A method according to claim 7, wherein said conductive layers of said first to fourth gate structure patterns are formed in a same process.

9. A method according to claim 8, wherein said conductive layers of said first to fourth gate structure patterns are formed of polysilicon.

10. A method according to claim 8, wherein said conductive layer of each of said first to fourth gate structure patterns is a polysilicon layer with impurity ions doped and a silicide layer.

11. A method according to claim 7, further comprising the step of:

forming a silicide layer on each of said portions of said first and second conductive layer patterns above said third and fourth gate structure patterns.

12. A method according to claim 7, wherein said step of forming a first conductive layer pattern and a second conductive layer pattern comprises the steps of:

forming a polysilicon layer on said first to fourth gate structure patterns via said first and second insulating layer patterns;

making a portion of said polysilicon other than said regions have resistance values lower than those of said regions; and patterning said polysilicon layer to form said first and second conductive layer patterns.

\* \* \* \* \*